United States Patent [19]
Iguchi et al.

[11] Patent Number: 5,744,394
[45] Date of Patent: Apr. 28, 1998

[54] METHOD FOR FABRICATING A SEMICONDUCTOR DEVICE HAVING COPPER LAYER

[75] Inventors: Katsuji Iguchi, Yamatokoriyama; Tsukasa Doi, Kitakatsuragi-gun; Masanori Murakami, Kyoto; Takeo Oku, Hitachinaka, all of Japan

[73] Assignee: Sharp Kabushiki Kaisha, Osaka, Japan

[21] Appl. No.: 839,025

[22] Filed: Apr. 23, 1997

[30] Foreign Application Priority Data

Aug. 26, 1996 [JP] Japan .................... 8-224018

[51] Int. Cl.$^6$ ............................. H01L 21/8246
[52] U.S. Cl. ................. 438/276; 438/278; 438/687
[58] Field of Search .................... 438/276–278, 438/643–649, 687–688; 257/290–291

[56] References Cited

U.S. PATENT DOCUMENTS 5,091,328  2/1992  Miller .................... 257/391
5,238,874  8/1993  Yamada ................ 438/687
5,354,712  10/1994  Ho et al. ............... 438/643

FOREIGN PATENT DOCUMENTS

05121697A  5/1993  Japan .
06151779A  5/1994  Japan .

*Primary Examiner*—John Niebling
*Attorney, Agent, or Firm*—Nixon & Vanderhye P.C.

[57] ABSTRACT

A semiconductor device comprises a plurality of transistors A semiconductor device comprising a plurality of transistors formed on a semiconductor substrate and a metal interconnection layer connected to at least one of the transistors, wherein the metal interconnection layer is composed of a single layer or multi layers, the single layer or at least one layer of the multi layers being formed of copper or a copper alloy, and is connected to at least one transistor wholly or partially through a barrier layer; and at least one of the transistor is controlled on its threshold voltage by a selective ion implantation after formation of the metal interconnection layer.

4 Claims, 5 Drawing Sheets

METHOD FOR FABRICATING A SEMICONDUCTOR DEVICE HAVING COPPER LAYER

BACKGROUND OF THE INVENTION

1. Field of the Invention

The present invention relates to a semiconductor device and a fabrication process therefor and, more particularly, to a semiconductor device functioning as a read only memory (ROM) and a fabrication process therefor.

2. Related Art

Figure 7:
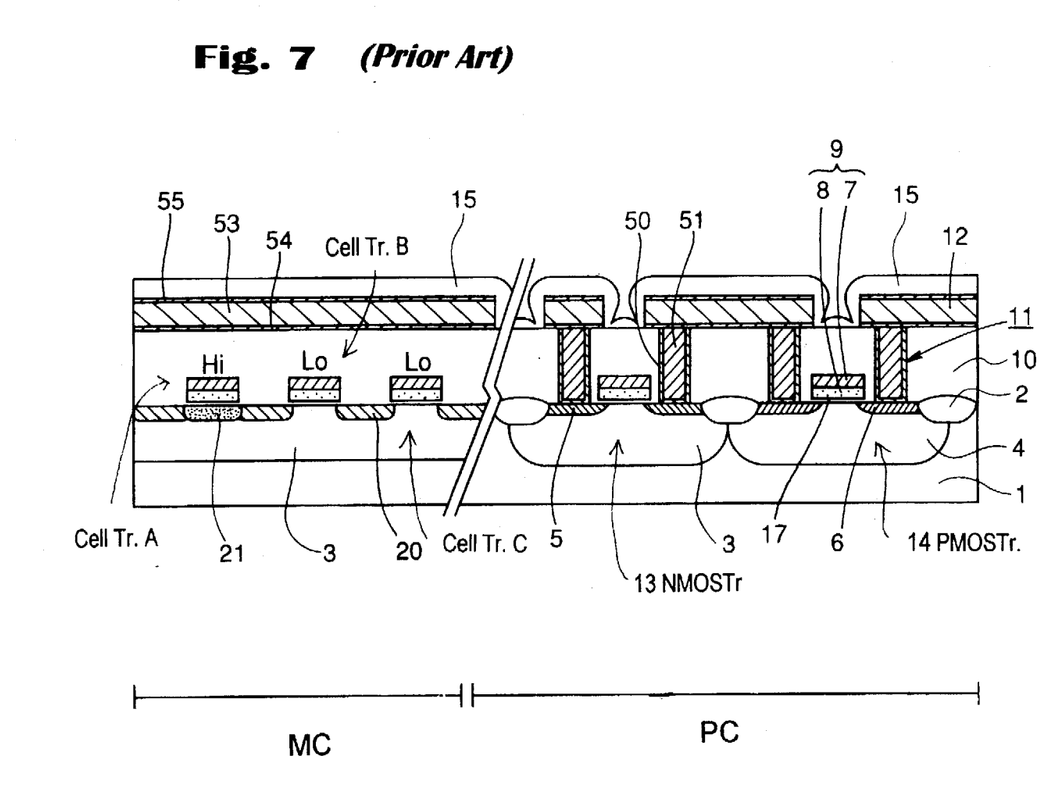
FIG. 7 is a schematic sectional view illustrating the construction of a prior art mask ROM.

Mask ROM devices currently put in mass production have a construction as shown in FIG. 7. Such a mask ROM device has a peripheral circuit region and a memory cell region.

In the memory cell region, gate electrodes 9 each formed of an $n^+$ polysilicon film 8 and a WSi film 7 are provided on a P-type well 3 formed in a silicon substrate 1. Channel stop diffusion layers (P type) 20 are disposed in parallel relation to the gate electrodes 9 to isolate the gate electrodes 9 from each other for formation of a plurality of cell transistors A, B and C (Cell Tr. A, B and C). In FIG. 7, the cell transistors B and C each store a LOW state. No special impurity diffusion layer is provided in channel regions below the gate electrodes 9 of the cell transistors B and C, which only contain an impurity implanted for formation of the P-type well 3. The transistor A stores a HIGH state. In a channel region below the gate electrode 9 of the cell transistor A is disposed a ROM writing diffusion layer (P type) 21. A BPSG film 10 is provided as an interlayer insulating layer over the cell transistors A, B and C. A metal interconnection layer formed of a laminate film of an AlCu layer 53 and a TiN or TiN/Ti layer 55 is provided on the BPSG film 10 with a TiN or TiN/Ti film 54 interposed therebetween. A passivation film 15 is provided on the metal interconnection layer.

In the peripheral circuit region, a P-type well 3, an N-type well 4 and device isolation regions 2 are disposed in the silicon substrate 1. Gate electrodes 9 formed of an $n^+$ polysilicon film 8 and a WSi film 7 are respectively provided on the P-type well 3 and the N-type well 4 with the intervention of a gate oxide film 17. N-type diffusion regions 5 (source/drain regions for an NMOS transistor 13) are disposed on the right and left sides of a gate electrode 9 in the P-type well 3, and P-type diffusion regions 6 (source/drain regions for a PMOS transistor 14) are disposed on the right and left sides of a gate electrode 9 in the N-type well 4. A BPSG film 10 is overlaid on the gate electrodes 9. Contact holes 11 extending to the N-type diffusion regions 5 and the P-type diffusion regions 6 are formed in the BPSG film 10 on the N-type diffusion regions 5 and the P-type diffusion regions 6. Contact plugs are formed of a W film 51 in the contact holes 11 with the intervention of a TiN/Ti film 50. As the metal interconnection layer in the memory cell region, a first-layer metal interconnection layer formed of a laminate film of an AlCu layer 53 and a TiN or TiN/Ti layer 55 is provided over the BPSG film 10 with a TiN or TiN/Ti film 54 interposed therebetween. A passivation film 15 is provided on the metal interconnection layer.

In a process for fabricating the device having the aforesaid construction, the formation of the ROM writing diffusion layer is typically achieved by ion implantation after the formation of the gate electrodes, followed by the formation of the BPSG films and activation of the diffusion layer by an annealing. Accordingly, the fabrication process for the device (after-gate method) requires many steps including at least the formation of the BPSG film, the annealing, the formation and filling of the contact holes and the formation of the metal interconnection layer after the ROM writing, thereby requiring a prolonged turnaround time from user's order of ROMs to delivery thereof.

Where an aluminum-based material is used for the metal interconnection layer and the ROM writing is achieved by ion implantation after formation of the metal interconnection layer, the annealing should be carried out at a temperature of not higher than 500° C. after the ion implantation. Therefore, the annealing cannot be carried out at a high temperature, so that the activation rate is reduced.

To shorten the turnaround time, Japanese Unexamined Patent Publication No. 5-121697 (1993), for example, proposes a method in which ion implantation is performed for ROM writing diffusion after formation of a metal interconnection layer.

Figure 8A:
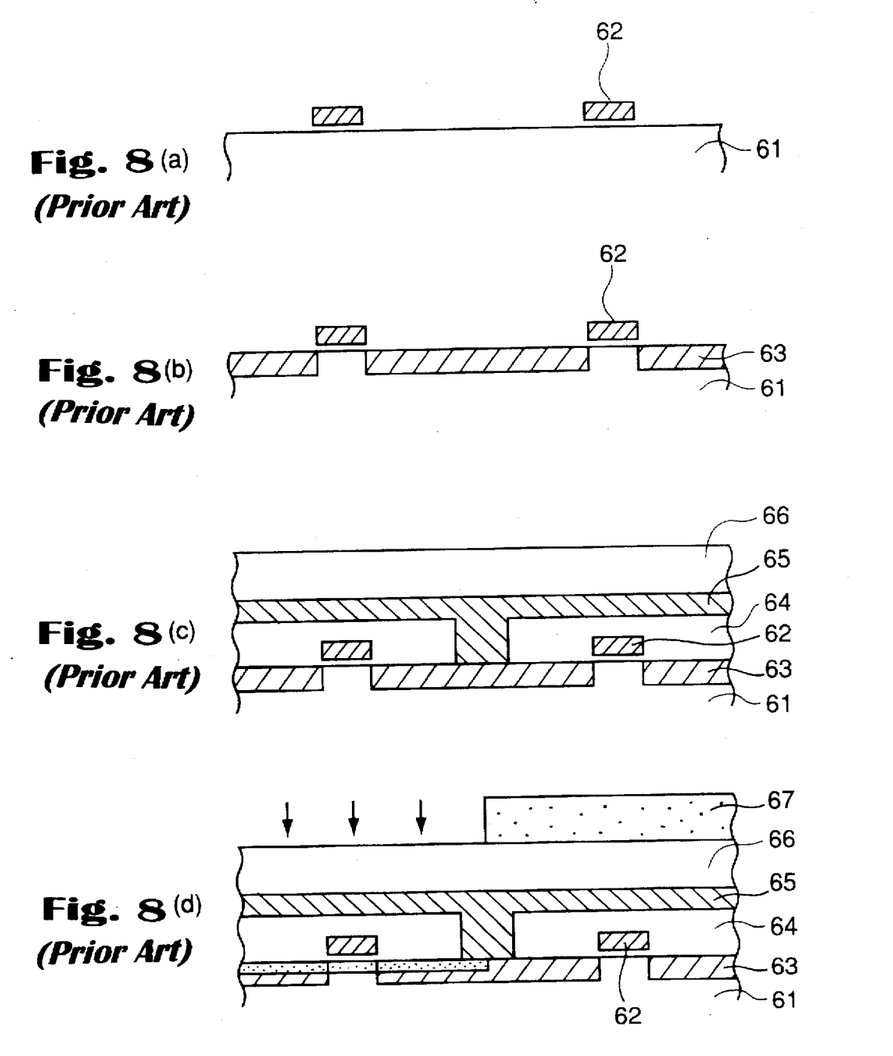

In accordance with the method, gate electrodes 62 are formed on a silicon substrate 61 (FIG. 8(a)), and then source/drain regions 63 are formed in the substrate 61 (FIG. 8(b)).

In turn, an interlayer insulating film 64 is formed on the resulting substrate, and a contact hole is formed in the interlayer insulating film 64. Then, a metal interconnection layer 65 is formed of a high melting point metal (e.g., a silicide or a polycide as a conductive material having a melting point not lower than 900° C.) on the interlayer insulating film 64 including the contact hole. A protective film 66 is formed on the metal interconnection layer 65 (FIG. 8(c)).

Subsequently, a resist mask 67 for the ROM writing is formed on the resulting substrate, and ion implantation is carried out with the use of the resist mask 67 (FIG. 8(d)).

Further, Japanese Unexamined Patent Publication No. 6-151779 (1994) proposes a process including the steps of: forming a gate electrode and source/drain regions on a silicon substrate; forming an interlayer insulating film over the resulting substrate; forming a contact hole; filling the contact hole with a TiW film, a TiN film, a TiN/Ti laminate film, a W film or a WSi film; performing ion implantation for ROM writing and annealing for activation of implanted ions; and forming an Al-based metal interconnection layer.

In accordance with the foregoing two arts, the ion implantation for the ROM writing and the annealing for the activation are carried out after or in the midst of the formation of the metal interconnection layer. In practice, however, it is impossible to form a metal interconnection layer which has a low resistance and a high melting point and is capable of withstanding the annealing for the activation while maintaining excellent contact characteristics. Therefore, these arts have not been put in practical use yet. The contact characteristics herein mean contact resistance of the metal interconnection layer to N-type diffusion layers or P-type diffusion layers (source/drain regions) and the gate electrodes and junction leakage characteristics with respect to the N-type diffusion layers or the P-type diffusion layers.

The interconnection formed of a silicide or a polycide disclosed in Japanese Unexamined Patent Publication No. 5-121697 (1993) has a resistance higher by one or two orders of magnitude than the aluminum-based interconnection of the prior art. Therefore, it is difficult to simultaneously form low resistance contacts between the interconnection and the N-type diffusion layers (source/drain regions) and between the interconnection and the P-type diffusion layers (source/drain regions) by using a silicide or a polycide alone for the interconnection. Where the metal interconnection layer is formed of a high melting point metal alone, the metal reacts with sillicon at the annealing, making it difficult to maintain excellent contact characteristics.

In the process disclosed in Japanese Unexamined Patent Publication No. 6-151779 (1994), the ion implantation for the ROM writing and the annealing are carried out after the TiW film or the like is formed, and then the aluminum-based interconnection is finely processed for reduction of the resistance of the interconnection. Therefore, the ROM writing is not carried out after the processing of the interconnection.

SUMMARY OF THE INVENTION

The present invention provides a semiconductor device comprising a plurality of transistors formed on a semiconductor substrate and a metal interconnection layer connected to at least one of the transistors, wherein the metal interconnection layer is composed of a single layer or multi layers, the single layer or at least one layer of the multi layers being formed of copper or a copper alloy, and is connected to at least one transistor wholly or partially through a barrier layer; and at least one of the transistor is controlled on its threshold voltage by a selective ion implantation after formation of the metal interconnection layer.

The present invention also provide a process for fabricating a semiconductor device, comprising the steps of: (i) forming a plurality of transistors on a semiconductor substrate; (ii) the forming an insulating film on the resulting substrate including the transistors, followed by formation of a contact hole and an interconnection trench in desired regions of the insulating film; (iii) forming a barrier layer in the contact hole and the interconnection trench, followed by filling the contact hole and the interconnection trench with copper or a copper alloy to form a metal interconnection layer on the barrier layer; (iv) conducting a selective ion implantation into at least one of the plurality of transistors to control its threshold voltage; and (v) annealing the resulting substrate for activation.

Thus, the present invention provides a semiconductor device and a fabrication process therefor in which an ion implantation for ROM writing and annealing for activation can be carried out after the formation of a metal interconnection layer having a resistance comparable to an aluminum-based interconnection, thereby shortening the turnaround time from the order of ROMs to the delivery thereof.

BRIEF DESCRIPTION OF THE DRAWINGS

FIGS. 8(a) to 8(d) are sectional views illustrating a process for fabricating another prior art mask ROM.

DESCRIPTION OF THE PREFERRED EMBODIMENTS

The semiconductor device of the present invention comprises a plurality of transistors formed on a semiconductor substrate and a metal interconnection layer connected to one or more of the transistors. A threshold voltage of at least one of the transistors are controlled by selective ion implantation after the formation of the metal interconnection layer. The semiconductor device of the present invention can be applied for e.g., a mask ROM, and microprocessors and logic devices incorporating therein mask ROMs. The semiconductor substrate to be used in the present invention is not limited, but is preferably a silicon substrate.

The transistors each comprise a gate electrode and source/drain regions formed on the semiconductor substrate. In the case of a mask ROM, for example, the transistors may be those formed in the peripheral circuit region or those formed in the memory cell region. At least one of the transistors in the memory cell region are typically subjected to the ion implantation for threshold voltage control after the formation of the metal interconnection layer. The gate electrode is formed of a single polysilicon layer, or a laminated layer of a silicide of a high melting point metal or a polycide by using a conventional deposition method. The formation of the source/drain regions can be achieved by a known method, and a layer of a silicide of a high melting point metal may be formed on the surfaces of the source/drain regions. Where the silicide layer is preliminarily formed, the contact resistance to the metal interconnection layer can be reduced as will be described later.

The metal interconnection layer may be connected to a gate electrode or a source/drain region of a transistor directly or indirectly, e.g., via a conductive layer such as of a metal or polysilicon, via a barrier layer described thereafter or via any of various elements. The metal interconnection layer of the present invention may be formed of a single layer or multi layers having two or more layers. The single layer or at least one layer of the multi layers is formed of copper or a copper alloy. The metal interconnection layer is typically connected to the transistors through a contact hole formed in an insulating film such as an interlayer insulating film. For example, the metal interconnection layer includes a contact portion (contact plug) formed by filling the contact hole and an interconnection portion having a desired pattern formed on the insulating film. Either the contact portion or the interconnection portion, e.g., only the interconnection portion, may be formed of copper or a copper alloy or, alternatively, both the contact portion and the interconnection portion may be formed of a laminate film of a copper or copper alloy layer and a conductive layer such as serving as a barrier layer. Where only the interconnection portion is formed of copper or a copper alloy, the contact portion may be formed of a material, such as tungsten, which is commonly used for the contact plug. Examples of specific copper alloys include an aluminum copper alloy, a copper tin (Sn) alloy and a copper zirconium (Zr) alloy. The thickness of the metal interconnection layer is not particularly limited, but may be that of a typical interconnection layer, for example, about 1,000 Å to about 5,000 Å. The copper alloy has a specific resistance of 1.7 $\mu\Omega$cm to 2.3 $\mu\Omega$cm which is lower than that of an aluminum alloy (2.7 $\mu\Omega$cm to 3.3 $\mu\Omega$cm), and has a higher melting point. Therefore, the metal interconnection layer of the copper alloy can have an interconnection resistance equivalent to that of an aluminum alloy interconnection even if the thickness thereof is 60% to 70% of that of the aluminum alloy interconnection. In the case of the mask ROM, metal interconnection layers in the memory cell region and the peripheral circuit region are preferably formed in the same step, but may be formed of different materials in different steps.

In the semiconductor device of the present invention, the metal interconnection layer is connected to the transistors wholly or partially through a barrier layer. Since the metal interconnection layer is connected to the surfaces of the source/drain regions and/or the gate electrodes of the transistors in many cases, some or all of these connection portions are preferably formed with a barrier layer. The material and structure of the barrier layer are not particularly limited, but the barrier layer may be formed of a metal layer typically employed as a barrier metal. Exemplary barrier layers include a single or a laminated layer of titanium compounds, tantalun compounds and tungsten compounds including nitrides thereof such as TiN, TiNOC, $TaC_xN_{1-x}$ (x=0 to 1) and $WN_x$. The barrier layer may otherwise be formed of an amorphous material such as TaC, TaN and TaNC. Where the barrier layer is formed of the amorphous material, a reaction between silicon and the metal interconnection layer of copper or the copper alloy can be suppressed during an annealing at a temperature of 700° C. to 800° C. The thickness of the barrier layer is not particularly limited, but may be that of a typical barrier metal which ensures that the metal interconnection layer has a proper interconnection resistance. For example, the thickness of the barrier layer is about 50 Å to about 1,000 Å. The barrier layer may have a double layer structure such as of TiN/Ti, TiNOC/Ti, $TaC_xN_{1-x}$ (x=0 to 1)/Ti, $WN_x$/Ti, TiN/Co, TiNOC/Co, $TaC_xN_{1-x}$ (x=0 to 1)/Co, $WN_x$/Co, TiN/Ni, TiNOC/Ni, $TaC_xN_{1-x}$ (x=0 to 1)/Ni or $WN_x$/Ni, which has an underlying layer of a silicide-forming material reactive with silicon. In such a case, however, the thickness of the barrier layer should be controlled so as not to adversely affect the contact characteristics. Where the underlying layer of the barrier layer is formed of the material reactive with silicon, the resulting silicide layer is interposed between the barrier layer and the surfaces of the source/drain regions and/or the gate electrodes of the transistors or between the barrier layer and another polysilicon interconnection, so that the contact resistance between the metal interconnection layer and the source/drain regions and/or the gate electrodes can be reduced. In the case of a device which is not significantly affected by the contact resistance, it is not necessary to form the underlying layer of the silicide-forming material.

In a process for fabricating a semiconductor device of the present invention, a plurality of transistors are formed on a semiconductor substrate in Step (i). As described above, the transistors can be formed in a conventional manner by using conventional materials. A silicide layer may be formed on gate electrodes and/or source/drain regions of the transistors in a conventional manner by using a silicide-forming material reactive with silicon.

In Step (ii), an insulating film is formed on the resulting substrate including the transistors, and contact holes and interconnection trenches are formed in desired regions of the insulating film. The insulating film is a single layer or a laminated layer such as of BPSG, PSG, NSG, P—$SiO_2$, $SiO_2$ and SiN. The diameters of the contact holes are properly determined in consideration of the size and the like of the device to be fabricated. The contact holes are preferably formed as extending to the surface of the silicon substrate (the source/drain regions of the transistors) or the surfaces of the gate electrodes by a known method such as photolithographic and etching processes. The interconnection trenches should be formed as embracing some or all of the contact holes. For example, a double layer insulating film including different material layers is first formed, then the interconnection trenches are formed in an upper layer of the insulating film, and the contact holes are formed in desired regions of the insulating film within the interconnection trenches. The dimensions of the interconnection trenches, which determine the width and thickness of the metal interconnection layer to be formed later, should be controlled such that the metal interconnection layer has a desired resistance.

In the present invention, Step (ii) and Step (iii) to be described later may be integrated into a single step. More specifically, the contact holes are first formed in the insulating film, and barrier layers and contact portions of the metal interconnection layer are formed as filling the contact holes in the insulating film. In turn, a second insulating film is formed on the resulting substrate, and the interconnection trenches are formed in the second insulating film. Then, barrier layers and interconnection portions of the metal interconnection layer are formed in the interconnection trenches. Thus, the interconnection portions and the previously formed contact portions are integrated to form the metal interconnection layer.

In Step (iii), a barrier layer having a desired thickness is formed in the contact holes and the interconnection trenches, and then the metal interconnection layer is formed on the barrier layer by filling the contact holes and the interconnection trenches with copper or a copper alloy. The barrier layer may be formed of any of the aforesaid materials. The formation of the barrier layer is achieved by a conventional method such as MOCVD, sputtering or vapor deposition. Prior to the formation of the barrier layer, a layer underlying the barrier layer may preliminarily be formed of a silicide-forming material reactive with silicon. In such a case, silicide layers are formed only on the bottoms of the contact holes, so that the silicide layers can be interposed between the metal interconnection layer and the connection portions of the transistors. The formation of the metal interconnection layer is achieved by a conventional method. More specifically, a copper or copper alloy film is formed on the entire surface of the insulating film including the contact holes and the interconnection trenches to fill the contact holes and the interconnection trenches, and then portions of the copper or copper alloy film outside the interconnection trenches are removed by an etching method such as CMP. The materials for the barrier layer in the contact portions and in the interconnection portions are not necessarily the same. Likewise, the materials for the metal interconnection layer in the contact portions and in the interconnection portions are not necessarily the same, but different materials may be properly selected. That is, different materials may be used only for the formation of the barrier layer, only for the formation of the metal interconnection layer, or both for the formation of the barrier layer and for the formation of the metal interconnection layer in the contact portions and in the interconnection portions.

In Step (iv), selected ones of the plurality of transistors are subjected to impurity ion implantation for threshold voltage control of the transistors. Since the metal interconnection layer is formed in the preceding step, impurity ions are implanted through the metal interconnection layer. For example, a mask having openings only on the selected transistors for the threshold voltage control is formed by a photolithographic process. With the use of the mask thus formed, ions of a conductivity type opposite to that of the source/drain regions are preferably implanted into the channel regions of the selected transistors through the metal interconnection layer and/or the gate electrodes thereof. The dose of the impurity ions is properly controlled depending on the threshold voltage to be set, and the implantation energy is properly controlled depending on the thickness of the metal interconnection layer, the gate electrodes, the insulating film and the mask.

In Step (v), the resulting substrate is annealed for activation of the impurity ions. The temperature and period for the annealing are properly determined such as to ensure sufficient activation of the impurity ions. In the present invention, the annealing may be carried out after the formation of the metal interconnection layer. Since the metal interconnection layer is formed of copper or a copper alloy, it is not necessary to limit the annealing temperature to a relatively low level like the case where an aluminum-based interconnection is employed. For example, the annealing may be carried out at a temperature of 700° C. to 900° C. for about 1 second to about 45 minutes. More specifically, the annealing may be carried out at 750° C. for 30 minutes or at 850° C. for 10 seconds.

A mask ROM of the present invention will hereinafter be described by way of embodiments thereof with reference to the attached drawings.

EMBODIMENT 1

Figure 1:
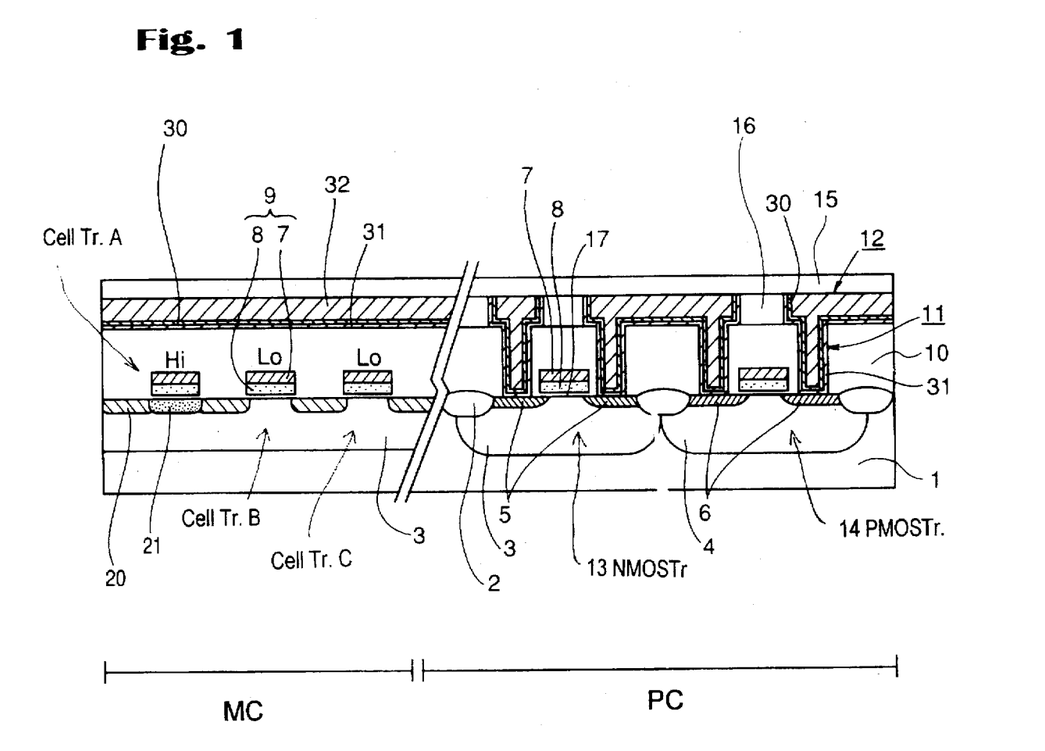
FIG. 1 is a schematic sectional view illustrating one exemplary mask ROM which is a semiconductor device according to the present invention.

A mask ROM of this embodiment has a construction as shown in FIG. 1. The mask ROM has a peripheral circuit region (PC) and a memory cell region (MC).

In the memory cell region, gate electrodes 9 each formed of an $n^+$ polysilicon film 8 and a WSi film 7 are provided on a P-type well 3 formed in a silicon substrate 1. Channel stop diffusion layers (P type) 20 are disposed in parallel relation to the gate electrodes 9 to isolate the gate electrodes 9 from each other for formation of a plurality of cell transistors A, B and C. The cell transistors B and C each store a LOW state. No special impurity diffusion layer is provided in channel regions below the gate electrodes 9 of the cell transistors B and C, which only contain an impurity implanted for formation of the P-type well 3. The transistor A stores a HIGH state. In a channel region below the gate electrode 9 of the cell transistor A is disposed a ROM writing diffusion layer (P type) 21. A BPSG film 10 is provided as an interlayer insulating film over the cell transistors A, B and C. A Ti film 31, a $TaC_xN_{1-x}$ film 30 as a barrier layer, a copper film 32 and a passivation film 15 are provided on the BPSG film 10. Though not shown, a first layer metal interconnection layer 12 comprised of the Ti film 31, the $TaC_xN_{1-x}$ film 30 and the copper film 32 is directly connected to the transistors formed in the memory cell region.

In the peripheral circuit region, a P-type well 3, an N-type well 4 and device isolation regions 2 are disposed in the silicon substrate 1. Gate electrodes 9 formed of an $n^+$ polysilicon film 8 and a WSi film 7 are respectively provided on the P-type well 3 and the N-type well 4 with the intervention of a gate oxide film 17. N-type diffusion regions 5 (source/drain regions for an NMOS transistor 13) are disposed on the right and left sides of a gate electrode in the P-type well 3, and P-type diffusion regions 6 (source/drain regions for a PMOS transistor 14) are disposed on the right and left sides of a gate electrode 9 in the N-type well 4. A BPSG film 10 is overlaid on the gate electrodes 9. Contact holes 11 extending to the N-type diffusion regions 5 and the P-type diffusion regions 6 are formed in the BPSG film 10 on the N-type diffusion regions 5 and the P-type diffusion regions 6. A P—SiO film 16 is overlaid on the BPSG film 10, and has interconnection trenches formed therein. The trenches overlie the contact holes 11. A $TaC_xN_{1-x}$ film 30 is provided in the contact holes 11 and the trenches with the intervention of a Ti film 31, and a copper film 32 is overlaid thereon as filling the contact holes 11 and the trenches. These films constitute a first layer metal interconnection layer 12 having contact portions and interconnection portions integrally formed.

The mask ROM of this embodiment is fabricated in the following manner. P-type wells 3 and/or N-type wells are formed in the peripheral circuit region and the memory cell region by a known method. Then, gate electrodes 9, source/drain regions 5, channel stop diffusion layers 20, a BPSG film 10 (interlayer insulating layer), a P—SiO film 16, contact holes and interconnection trenches are formed by known methods. In turn, the filling of the contact holes 11 and the formation of a metal interconnection layer are simultaneously carried out.

More specifically, the trenches are formed to a depth of 500 nm in the P—SiO film 16, and the contact holes 11 are formed as extending through the BPSG film 10 to the silicon substrate 1.

In turn, a 60-nm thick Ti film 31 and a 150-nm thick $TaC_xN_{1-x}$ film 30 are formed in the contact holes and the interconnection trenches and on the BPSG film 10 in a memory cell region and, thereafter, the resulting substrate is subjected to an annealing at 650° C. for 15 seconds. Then, a 600 nm thick copper film 32 is formed over the resulting substrate.

Subsequently, the copper film 32, the $TaC_xN_{1-x}$ film 30 and the Ti film 31 formed on the P—SiO film 16 outside the trenches are etched away by the CMP method. Thus, a first layer of a metal interconnection layer 12 is formed only in the contact holes 11 and the trenches.

In this embodiment, the metal interconnection layer is formed of the unalloyed copper film 32 having a thickness of 300 nm. The metal interconnection layer has a sheet resistance of about 70 m Ω which is comparable to an aluminum-based interconnection.

A $TaC_xN_{1-x}$ film generally has a superior barrier property against copper and, if having a thickness of 25 nm, can withstand an annealing at 700° C. for 30 minutes and a rapid annealing at 850° C. for 10 seconds. These annealings ensure sufficient activation of an impurity (e.g., boron) implanted for ROM writing after the formation of the metal interconnection layer. The Ti film 31 underlying the barrier layer reacts with silicon in the interface of the silicon substrate 1 to form a silicide layer. Thus, the contact resistances to the N-type diffusion layer 5, the P-type diffusion layer 6 and the gate electrode 9 can be reduced to 100 Ω, 200 Ω and 30 Ω, respectively (contact diameter: 400 nm, depth: 1000 nm).

After the formation of the first layer of the metal interconnection layer 12, boron ions are implanted into the channel region of the cell transistor A (Cell Tr. A) in the memory cell region in a dose of about $2\times10^{13}$ cm$^{-2}$ at an implantation energy of about 500 keV, and then the resulting substrate is subjected to an annealing at about 850° C. for 10 seconds.

A 16-Mb MROM-LSI is fabricated by employing mask ROM devices formed in the aforesaid manner. The MROM-LSI thus fabricated has electrical characteristics comparable to a prior art device having substantially the same design. Further, the fabrication process according to this embodiment can shorten the turnaround time in comparison with the prior art fabrication process.

EMBODIMENT 2

A mask ROM of this embodiment has substantially the same construction as that of Embodiment 1 except for the metal interconnection layer including a contact portion and an interconnection portion.

Figure 2:
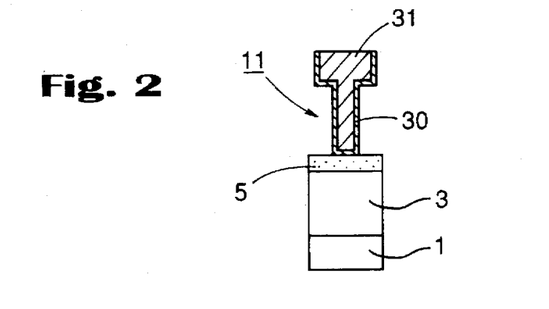
FIG. 2 is a schematic sectional view illustrating major portions of one exemplary metal interconnection layer of the mask ROM according to the present invention.

As shown in FIG. 2, a $TaC_xN_{1-x}$ film 30 is provided as a barrier layer in a contact hole 11 and a trench, and a copper film 32 is provided thereon as filling the contact hole 11 and the trench to form the first layer of the metal interconnection layer which comprises the contact portion and the interconnection portion.

EMBODIMENT 3

A mask ROM of this embodiment has substantially the same construction as that of Embodiment 1 except for the metal interconnection layer including a contact portion and an interconnection portion.

Figure 3:
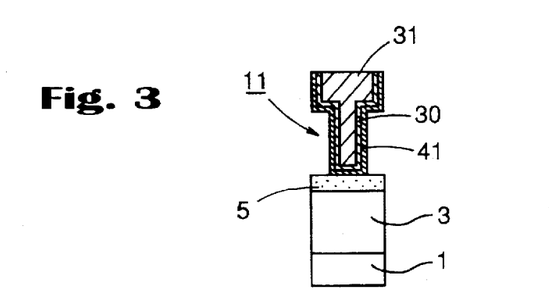
FIG. 3 is a schematic sectional view illustrating major portions of another exemplary metal interconnection layer of the mask ROM according to the present invention.

As shown in FIG. 3, a $TaC_xN_{1-x}$ film 30 is provided as a barrier layer in a contact hole 11 and a trench with the intervention of a $TiSi_2$ film 41, and a copper film 32 is provided thereon as filling the contact hole 11 and the trench to form the first layer of the metal interconnection layer which comprises the contact portion and the interconnection portion.

EMBODIMENT 4

A mask ROM of this embodiment has substantially the same construction as that of Embodiment 1 except for the metal interconnection layer including a contact portion and an interconnection portion.

Figure 4:
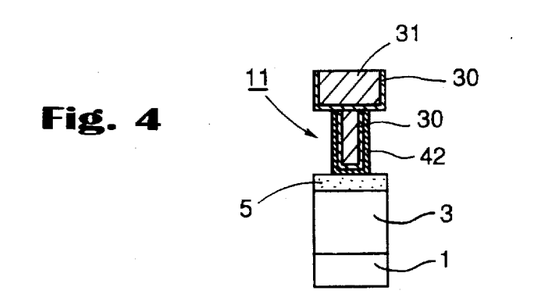
FIG. 4 is a schematic sectional view illustrating major portions of further another exemplary metal interconnection layer of the mask ROM according to the present invention.

As shown in FIG. 4, a $TaC_xN_{1-x}$ film 30 is provided as a barrier layer in a contact hole 11 with the intervention of a Ti or $TiSi_2$ film 42, and a copper film 32 is provided thereon as filling the contact hole 11 to form the contact portion. Further, a $TaC_xN_{1-x}$ film 30 is provided as a barrier layer in a trench overlying the contact portion, and a copper film 32 is provided thereon as filling the trench to form the interconnection portion.

EMBODIMENT 5

A mask ROM of this embodiment has substantially the same construction as that of Embodiment 1 except for the metal interconnection layer including a contact portion and an interconnection portion.

Figure 5:
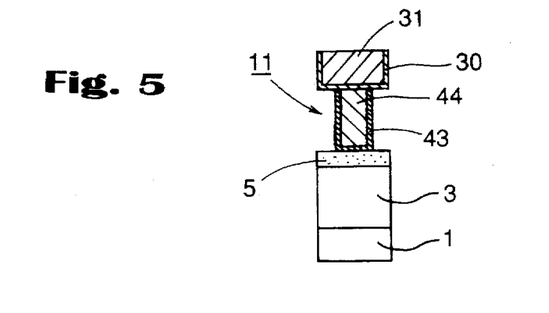
FIG. 5 is a schematic sectional view illustrating major portions of still another exemplary metal interconnection layer of the mask ROM according to the present invention.

As shown in FIG. 5, a TiN/Ti laminate film 43 is provided in a contact hole 11, and a W film 44 is provided thereon as filling the contact hole 11 to form the contact portion. It is noted that the TiN layer serves as a barrier layer against the W film 44. Further, a $TaC_xN_{1-x}$ film 30 is provided as a barrier layer in a trench overlying the contact portion, and a copper film 32 is provided thereon as filling the trench to form the interconnection portion.

In this embodiment, the copper film 31 is used for the first layer of the metal interconnection layer and the $TaC_xN_{1-x}$ film 30 is used as the barrier layer as in Embodiment 1. This arrangement in the burried contact portion is proved to be effective by a prior art, and ensures stable contact characteristics because the interconnection formed of copper can withstand the annealing after the ion implantation. Since the plug of the contact portion is formed of the W film, it is not necessary to deposit the barrier layer to a greater thickness on the bottom of the contact hole to enhance the barrier property. Therefore, the thickness of the barrier layer can be reduced in comparison with Embodiment 1. This is because tungsten is less reactive with silicon than copper.

A 16-Mb MROM-LSI is fabricated by employing mask ROM devices formed in the aforesaid manner. The MROM-LSI thus fabricated has excellent contact characteristics and electrical characteristics as in Embodiment 1. Further, the fabrication process ensures a high yield and shortens the turnaround time in comparison with the prior art fabrication process.

EMBODIMENT 6

A mask ROM of this embodiment has substantially the same construction as that of Embodiment 1 except for the metal interconnection layer including contact portions and interconnection portions and the electrodes on the substrate.

Figure 6:
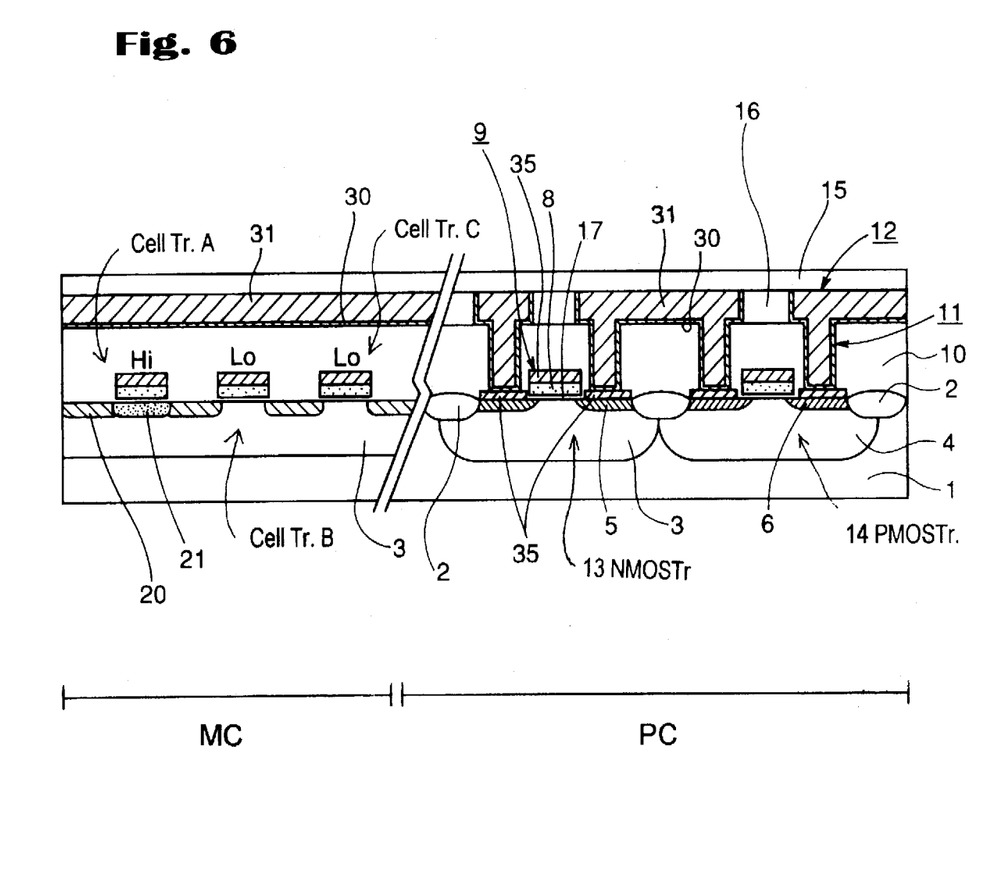
FIG. 6 is a schematic sectional view illustrating another exemplary mask ROM which is a semiconductor device according to the present invention.

As shown in FIG. 6, a $TaC_xN_{1-x}$ film 30 is provided as a barrier layer in contact holes and trenches, and a copper film 32 is provided thereon as filling the contact holes and the trenches to form the first layer of the metal interconnection layer 12 which comprises the contact portions and the interconnection portions.

Further, the gate electrodes 9, the N-type diffusion layers 5 and the P-type diffusion layers 6 each have on the upper surface thereof a Ti silicide layer formed by a known method (the $TiSi_2$ films are formed in a self-alignment manner).

In this embodiment, the contact portions are formed on the $TiSi_2$ film. Therefore, the contact resistance can be reduced without forming the Ti film in the contact holes.

In accordance with the present invention, the combinational use of a barrier layer and a metal interconnection layer capable of withstanding a high temperature allows the annealing to be performed at a higher temperature after the formation of the metal interconnection layer in a semiconductor device fabrication process which is adapted to control the threshold voltages of transistors by ion implantation after the formation of the metal interconnection layer. The resulting semiconductor device has contact characteristics and interconnection characteristics comparable to the prior art semiconductor device, and can be put in practical use.

Since the ROM writing can be carried out after the formation of the metal interconnection layer, the turnaround time can be shortened from two weeks to one week.

Although the present invention has been described in detail by way of the embodiments thereof, it should be understood that various modifications and changes may be made without departing from the spirit and scope of the invention as defined by the appended claims.

What is claimed is:

1. A process for fabricating a semiconductor device, comprising the steps of:
   (i) forming a plurality of transistors on a semiconductor substrate;
   (ii) forming an insulating film on the resulting substrate including the transistors, followed by the formation of a contact hole and an interconnection trench in desired regions of the insulating film;

(iii) forming a barrier layer in the contact hole and the interconnection trench, followed by filling the contact hole and the interconnection trench with copper or a copper alloy to form a metal interconnection layer on the barrier layer;

(iv) conducting a selective ion implantation into at least one of the plurality of transistors using a resist pattern as a mask to control its threshold voltage after the completion of the interconnection layer; and (v) annealing the entire resulting substrate for activation, uniformly.

2. A process of claim 1, wherein a silicide layer is formed after step (ii) and before step (iii).

3. A process of claim 1, wherein the barrier layer is composed of a tantalum compound, a titanium compound or a tungsten compound.

4. A process of claim 1 wherein an annealing temperature ranges from 700° C. to 900° C. in step (v).

* * * * *